United States Patent
Tsujimura et al.

(10) Patent No.: US 6,608,658 B1
(45) Date of Patent: Aug. 19, 2003

(54) TOP GATE TFT STRUCTURE HAVING LIGHT SHIELDING LAYER AND METHOD TO FABRICATE THE SAME

(75) Inventors: Takatoshi Tsujimura, Fujisawa (JP); Takashi Miyamoto, Chofu (JP)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 09/620,114

(22) Filed: Jul. 20, 2000

(30) Foreign Application Priority Data

Jan. 4, 2000 (JP) ........................................ 2000-000022

(51) Int. Cl.$^7$ ........................................... G02F 1/1333
(52) U.S. Cl. ........................... 349/110; 349/44; 349/47; 349/111; 438/30
(58) Field of Search .................... 349/141, 44, 47, 349/46, 110, 111; 438/30

(56) References Cited

U.S. PATENT DOCUMENTS

| | | | |
|---|---|---|---|
| 4,948,231 A | * | 8/1990 | Aoki et al. .................. 350/334 |
| 5,223,961 A | * | 6/1993 | Ukai et al. ..................... 359/59 |
| 5,233,211 A | * | 8/1993 | Hayashi et al. ............. 257/347 |
| 5,552,909 A | * | 9/1996 | Onisawa et al. .............. 349/42 |
| 6,057,904 A | * | 5/2000 | Kim et al. .................. 349/143 |
| 6,319,760 B1 | * | 11/2001 | Lee et al. .................... 438/161 |

* cited by examiner

Primary Examiner—Toan Ton
Assistant Examiner—Andrew Schechter
(74) Attorney, Agent, or Firm—Scully, Scott, Murphy & Presser; Robert M. Trepp

(57) ABSTRACT

The present invention provides a method of fabricating a TFT structure by two masking processes. More specifically, a light shielding layer and an interlayer insulating layer are sequentially formed on a substrate, and then source/drain electrodes are formed on the interlayer insulating layer (a first masking step). A semiconductor layer, a gate insulating layer and a gate metal layer are sequentially formed so as to cover the source/drain electrodes, and a gate electrode is formed in a second masking step. Subsequently, the gate insulating layer and the semiconductor layer are etched, and the interlayer insulating layer and the light shielding layer, which are disposed under the source/drain electrodes, are etched using the source/drain electrodes as a mask, thus obtaining a top gate TFT structure. When the interlayer insulating layer and the gate insulating layer are made of an insulating material containing $SiO_X$ and $SiN_X$ as a main component, the gate insulating layer and the semiconductor layer are naturally over-etched more than the interlayer insulating layer and the light shielding layer by plasma-etching with mixed gas of $CF_4$ and hydrogen, thus obtaining a TFT structure with a high reliability, which is free from a problem of occurrence of photo-induced leak current.

29 Claims, 3 Drawing Sheets

TOP GATE TFT STRUCTURE HAVING LIGHT SHIELDING LAYER AND METHOD TO FABRICATE THE SAME

BACKGROUND OF THE INVENTION

1. Technical Field

The present invention relates to an active matrix liquid crystal display device, more particularly to a thin film transistor (hereinafter referred to as TFT) array which serves as a switching device for operating the liquid crystal display device and a method of fabricating the same.

2. Prior Art

Liquid crystal display devices (hereinafter referred to as LCD) have been wisely used. While the LCD has been desired to display a high quality picture image, a demand for a low cost of the LCD has been more increased. Accordingly, a structure of the LCD capable of being fabricated in the small number of fabrication steps and achieving a high throughput has been strongly desired. A method of fabricating such LCD has also been desired for similar reasons.

The TFT functions as a switching device that is one of important components to operate the LCD. The fabrication of the TFT array structure requires the considerable number of fabrication steps in the total LCD fabrication steps, and hence requires a high fabrication cost. Moreover, since a defective ratio in each of the steps is multiplied with others, a reduction in a yield rate is brought about due to a large number of fabrication steps. Accordingly, a reduction in the number of steps for fabricating the TFT array structure is convinced to contribute significantly to reduce a cost of the LCD incorporating the TFT. For this reason, in stead of a reverse stagger structure and a bottom gate TFT structure shown in FIG. 1(b) which have been heretofore adopted generally, a stagger structure which can be fabricated in fewer photolithography steps, that is, a top gate TFT structure shown in FIG. 1(a), has been attracted.

The top gate TFT structure can be theoretically fabricating with two photo-masks. However, since a channel region is normally made of a semiconductor exhibiting a photoconductive property, amorphous silicon (a-Si), photo-induced leak current is caused due to exposure to external light or a backlight through a transparent substrate such as glass, thus causing problems of such significant deterioration in a display quality of the LCD and an erroneous operation thereof. Therefore, a light shielding layer must be provided at a lower portion of the top gate TFT structure. The light shielding layer is normally made of metallic material. To allow light to transmit through a pixel portion and to prevent an occurrence of parasitic capacitance in a wiring portion owing to a metal/dielectric/semiconductor structure, the light shielding layer made of the metallic material must be removed in the pixel portion and the wiring portion. Accordingly, another mask is further required to pattern the light shielding layer. In the end, to fabricate the top gate TFT structure, at least three masks are needed.

In Japanese Patent Laid-Open No. Hei 9(1997)-68727, a technology in which a light shielding layer and an a-Si layer are formed by the same pattern is disclosed. In this gazette, three masking processes using a mask for forming a gate electrode and a gate insulating layer, a mask for patterning the a-Si layer and the light shielding layer and a mask for forming pixel electrodes and signal lines are disclosed. In the TFT structure in which the a-Si layer and the light shielding layer are formed by the same pattern, a light which is made to be incident perpendicularly onto the light shielding layer is shielded by the light shielding layer. However, a light such as a scattered light, which is made to be incident onto the light shielding layer from directions other than the vertical direction, cannot be shielded sufficiently by the light shielding layer. Thus, the incidence light reaches the edge portion of the a-Si layer, and photo-induced leak current may occur.

The object of the present invention is to provide a method of fabricating a TFT structure using a fewer number of masks, accordingly, in a fewer number of fabrication steps.

Another object of the present invention is to provide a TFT structure free from a problem of photo-induced leak current and exhibiting a high reliability, and a method of fabricating the same.

SUMMARY OF THE INVENTION

According to the present invention, a method of fabricating a TFT structure by two masking processes is provided. The method of fabricating a TFT structure of the present invention comprises the steps of: depositing a light shielding layer on a substrate; depositing an interlayer insulating layer on the light shielding layer; forming source/drain electrodes on the interlayer insulating layer (a first masking step); and depositing a semiconductor layer, a gate insulating layer and a gate metal layer on the interlayer insulating layer sequentially so as to cover the source/drain electrodes; etching the gate metal layer, the gate insulating layer and the semiconductor layer using a resist pattern for use in forming a gate electrode (a second masking step); and etching the interlayer insulating layer and the light shielding layer using the source/drain electrodes as a mask.

The TFT structure fabricated by the method of the present invention has a structure that the semiconductor layer and the light shielding layer are formed in alignment with each other, and a periphery of the semiconductor layer is inside of a periphery of the light shielding layer and does not cross the periphery of the light shielding layer. Accordingly, in case that a scattered light exists, no photo-induced leak current at an edge region of the semiconductor layer occurs.

Moreover, by properly selecting the combination of insulating substances forming the interlayer insulating layer and the gate insulating layer, it is possible to utilize etching selectivity of these insulating substances. Thus, the structure that the periphery of the semiconductor layer is inside of the periphery of the light shielding layer can be obtained without requiring any additional step. To be more specific, the interlayer insulating layer is made of an insulating substance containing $SiO_X$ and $SiO_XN_Y$ as a main component, and the gate insulating layer is made of an insulating substance containing $SiN_X$ as a main component. When a plasma etching is performed using a mixed gas containing $CF_4$ and hydrogen, the gate insulating layer and the semiconductor layer are naturally over-etched compared to the interlayer insulating layer.

BRIEF DESCRIPTION OF THE DRAWINGS

Preferred embodiments of the present invention will now be described, by way of example only, with reference to the accompanying drawings in which.

DETAILED DESCRIPTION OF THE PREFERRED EMBODIMENTS OF THE INVENTION

The present invention provides a method of fabricating a TFT structure using two masking processess. In the method of fabricating a TFT structure of the present invention, a mask for use in forming source/drain electrodes and a mask for use in forming a gate electrode are only used. Additional masks other than them are unnecessary. Descriptions for a preferred embodiment to fabricate a top gate TFT structure according to the method of the present invention will be described with reference to the accompanying drawings.

FIGS. 2(a) to 2(e) are sectional views showing steps of fabricating the tope gate TFT structure according to the method of the present invention.

Figure 1A:
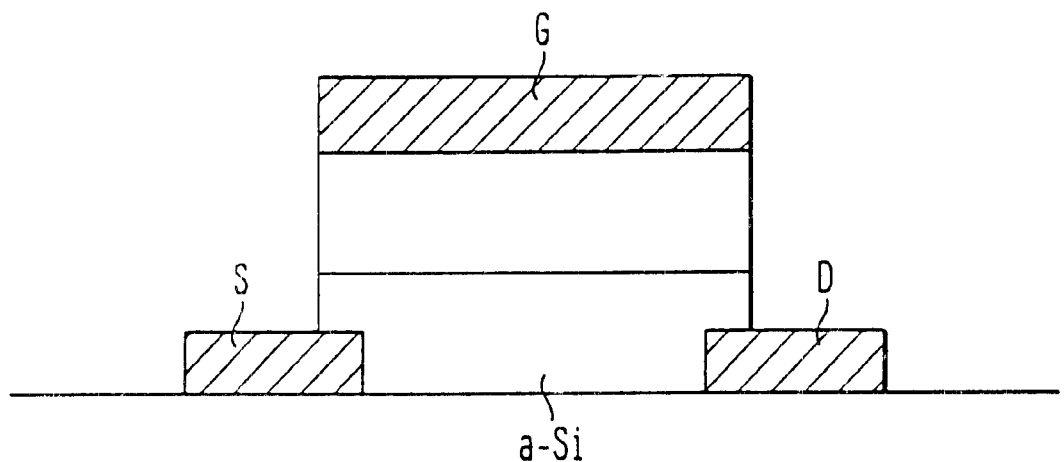
FIG. 1(a) is a schematic view showing a top gate TFT structure.
Figure 1B:
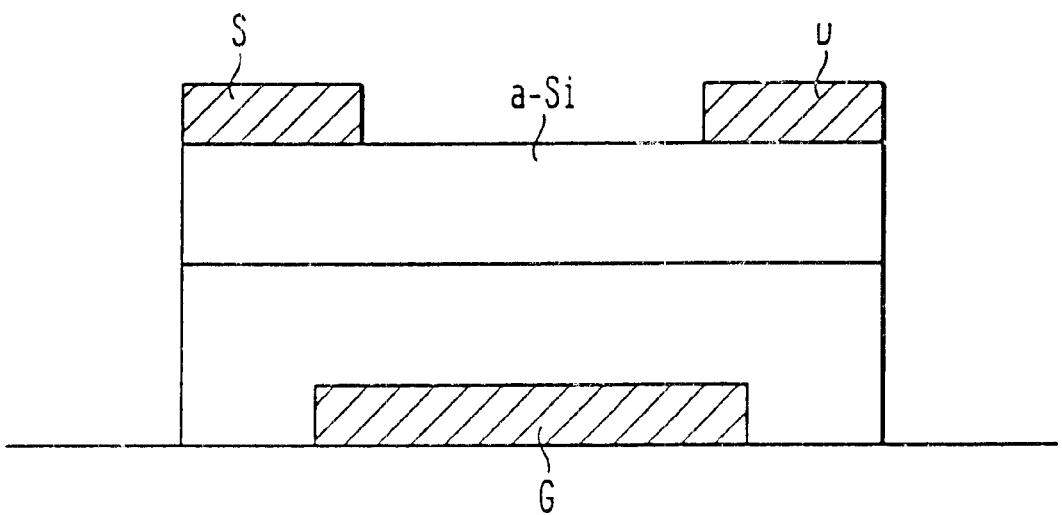
FIG. 1(b) is a schematic view showing a bottom gate TFT structure.
Figure 2A:
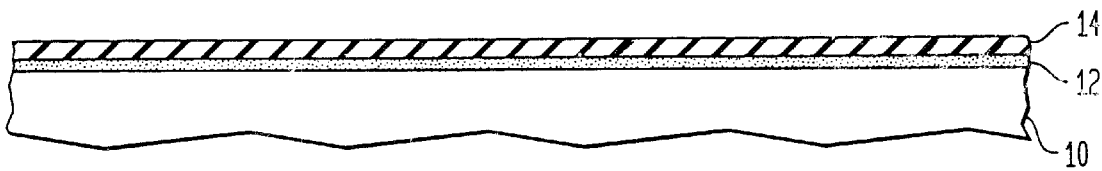
FIGS. 2(a) to 2(e) are sectional views showing steps of the method of fabricating a TFT structure of the present invention.

As shown in FIG. 2(a), a light shielding layer 12 is deposited on an entire surface of an array substrate 10, which is a transparent substrate typified by such as a glass substrate. The light shielding layer 12 should be a nonmetallic light shielding layer. As substances suitable for the nonmetallic light shielding layer, there are germanium compounds such as GeSi:H, germanium oxide $GeO_X$ and germanium nitride $GeN_X$, and niobium compound such as niobium oxide $NbO_X$. The most preferable light shielding layer is a GeSi:H layer. This GeSi:H layer can be deposited by sputtering which uses a target of, for example, GeSi (Ge:Si=1:1) in an atmosphere of mixed gas of argon and hydrogen with an acceleration voltage of 1 kW. A thickness of the light shielding layer 12 is set to be at least 2000 Å or more, preferably a range of about 3000 to about 4000 Å. In the case where the nonmetallic light shielding layer as exemplified above is used, a leak current may flow due to a defect level in the nonmetallic light shielding layer. Accordingly, if source/drain electrodes 16 are provided just above the light shielding layer, a leak current of about 1 Å10×10$^{-10}$. A flows owing to a pulse voltage used in the TFT-LCD, and a degradation problem in a display quality of the LCD may occur. To avoid such problems, an interlayer insulating layer 14 is deposited on the entire surface of the light shielding layer 12. The interlayer insulating layer 14 should be made of an insulating substance containing $SiO_X$ or $SiO_XN_Y$ as a main component.

Figure 2B:
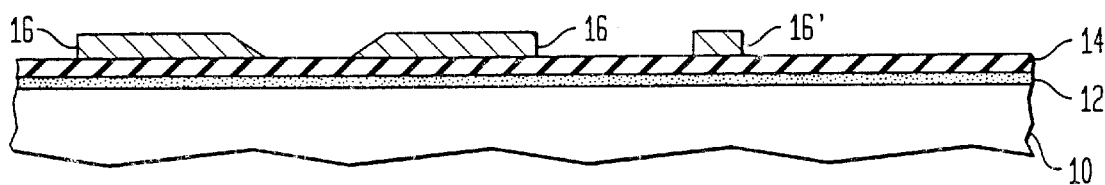

Next, source/drain electrodes 16 and a common electrode 16 in data lines or an IPS-TFT-LCD are formed on the interlayer insulating layer 14 as shown in FIG. 2(b). The source/drain electrodes 16 and the common electrode 16 are made of a conductive layer such as MoW, and patterned using an ordinary photolithography technique. Accordingly, a first mask includes a pattern to form the source/drain electrodes 16. Here, the object to be patterned is only a conductive layer to form the source/drain electrodes 16 and the common electrode 16, and the interlayer insulating layer 14 formed under the source/drain electrodes 16 and the common electrode 16 is left as the layer 14 is deposited on the entire surface of the light shielding layer 12, and, as a matter of course, the light shielding layer 12 deposited under the interlayer insulating layer 14 is left as the layer 14 is deposited on the entire surface of the array substrate 10.

Figure 2C:
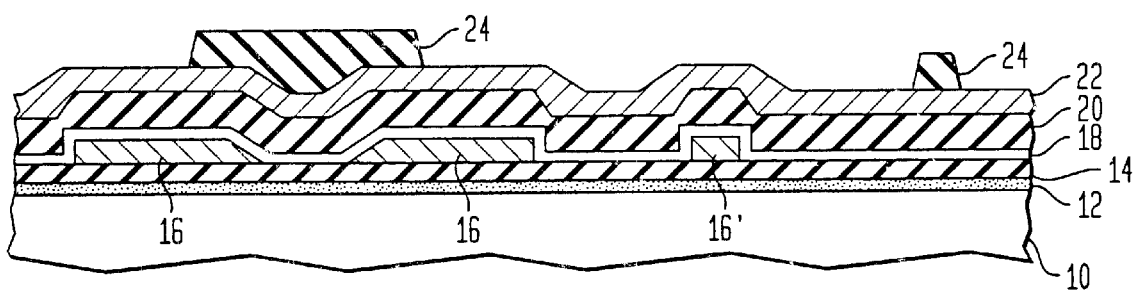
Figure 2D:
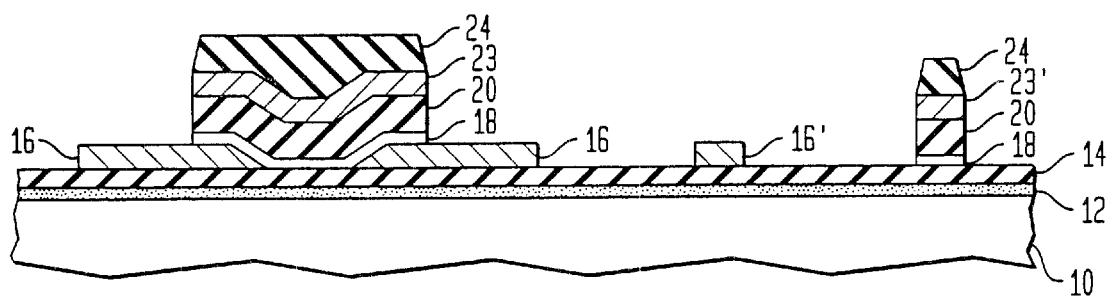

Moreover, a semiconductor layer 18 is deposited on the entire surface of the interlayer insulating layer 14 with overlaying the source/drain electrodes 16 as shown in FIG. 2(c). The semiconductor layer 18 is usually made of amorphous silicon, and the layer 18 can be made of semiconductor materials such as compound semiconductors including polycrystalline CdS and CdSe, polycrystalline silicon and amorphous silicon (a-Si). Subsequently, a gate insulating layer 20 is deposited on the entire surface of the semiconductor layer 18 (see FIG. 2(c)). Considering etching steps to be performed later, the gate insulating layer 20 should be made of an insulating material different from that which forms the interlayer insulating layer 14. Although the insulating material to form the gate insulating layer 20 is selected depending on etching conditions in the etching steps to be performed later, the gate insulating layer 20 should be made of a material more prone to be etched than the interlayer insulating layer 14. When the interlayer insulating layer 14 is formed by, for example, a material including silicon oxide, the gate insulating layer 20 is formed by a material containing silicon nitride $SiN_X$ as a main component.

Thereafter, a conductive layer 22 made of such as Mo is deposited on the gate insulating layer 20, and then the conductive layer 22 is patterned, thus forming a gate electrode 23, a gate line and a pixel electrode 23' in the IPS-TFT-LCD (FIG. 2(c)). It should be noted that the gate electrode 23 and the pixel electrode 23' may be formed of a plurality of conductive layers including a Mo layer, an Al layer and the like. The gate electrode 23 and the pixel electrode 23' are formed by an ordinary photolithography technique. Specifically, a resist compound 24 is applied onto the conductive layer 22 deposited on the entire surface of the gate insulating layer 20, and the resist compound 24 is pre-baked if necessary. Thereafter, the resist compound 24 is exposed to radiation ray through a second mask including a pattern of the gate electrode 23. After the exposure, postbaking is performed if necessary, the resist compound 24 is developed using proper developing agent. The obtained structure is a lamination structure composed of the substrate 10, the light shielding layer 12, the interlayer insulating layer 14, the source/drain electrodes 16, the semiconductor layer 18, the gate insulating layer 20, the conductive layer 22 for use in forming the gate electrode and the resist compound 24 which is left only on regions which are to be used as the gate electrode 23 and the pixel electrode 23', as shown in FIG. 2(c).

The conductive layer 22 for use in forming the gate electrode is patterned using the pattern of the resist compound 24 obtained as a mask, thus forming the gate electrode 23. Subsequently, the gate insulating layer 20 and the semiconductor layer 18, which are located under the conductive layer 22, are simultaneously patterned. Thus, the structure shown in FIG. 2(d) can be obtained, and, in the regions which are not covered with the resist compound 24, the source/drain electrodes 16 and the interlayer insulating layer 14 are exposed.

Figure 2E:
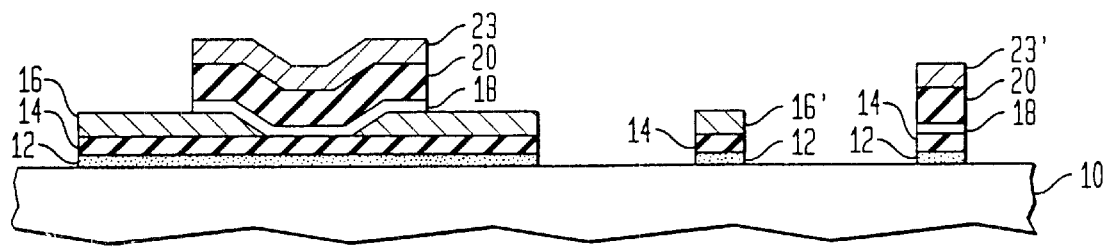

Next, the interlayer insulating layer 14 and the light shielding layer 12 are patterned using one of the patterns of the resist compound 24 and the gate electrode 23, and the source/drain electrodes 16 as a mask. By removing the resist compound 24, the top gate TFT structure can be obtained as shown in FIG. 2(e). The top gate TFT structure obtained by the method of the present invention has a structure that the semiconductor layer 18 and the light shielding layer 12 are formed so as to be self-aligned with each other, and the periphery of the semiconductor layer 18 is inside of the periphery of the light shielding layer 12 and does not cross the periphery of the light shielding layer 12. Accordingly, no photo-induced leak current at the edge region of the semiconductor layer 18 occurs in spite of existence of scattered light.

Figure 3A:
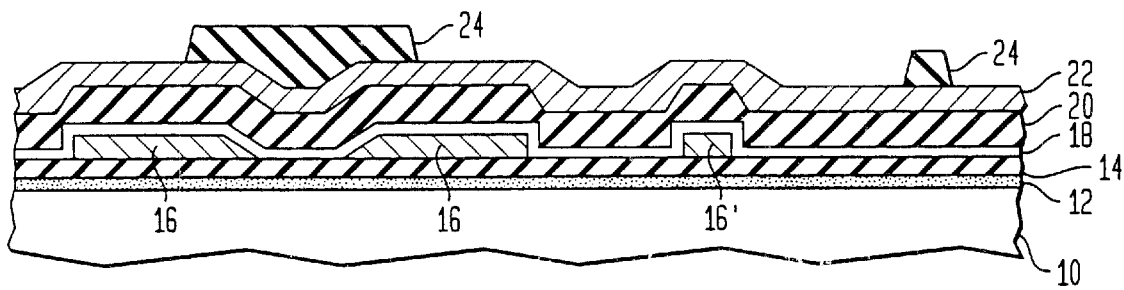
FIGS. 3(a) to 3(d) are sectional views showing steps of the method of fabricating a TFT structure of the present invention.
Figure 3B:
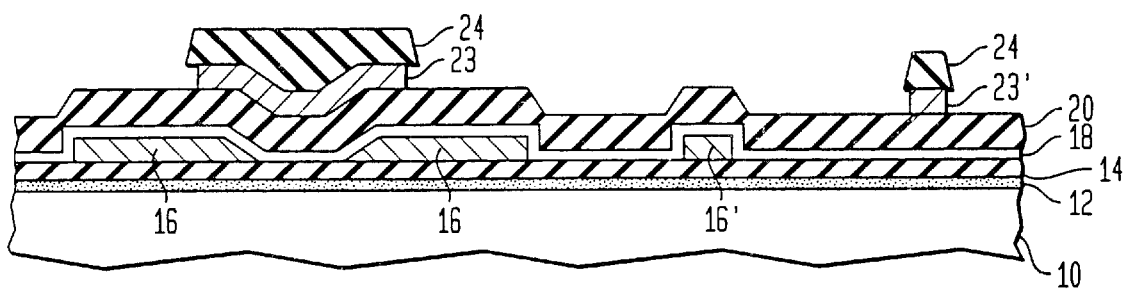

Furthermore, according to a further preferred embodiment of the present invention, after the top gate TFT structure shown in FIG. 2(c) is obtained (FIG. 3(a)) by the above described method, the conductive layer 22 for use in forming the gate electrode is patterned by isotropic etching using the pattern of the obtained resist compound 24. Thus, the gate electrode 23 is formed. The applicable isotropic etching includes wet etching using proper etchant such as aqueous solution of acid selected from, for example, $H_3PO_4$, $HNO_3$ and $CH_3COOH$ or mixture of these chemicals, or chemical dry etching using Hcl and $Bcl_3$. As shown in FIG. 3(b), the conductive layer 22 for use in forming the gate electrode should be preferably over-etched more than the pattern of the resist compound 24 as the mask. An offset length can be provided around the gate electrode 23 by over-etching the gate electrode 23, and leak current and short-circuit between the gate electrode 23 and the source/drain electrodes 16 can be prevented as described later.

Figure 3C:
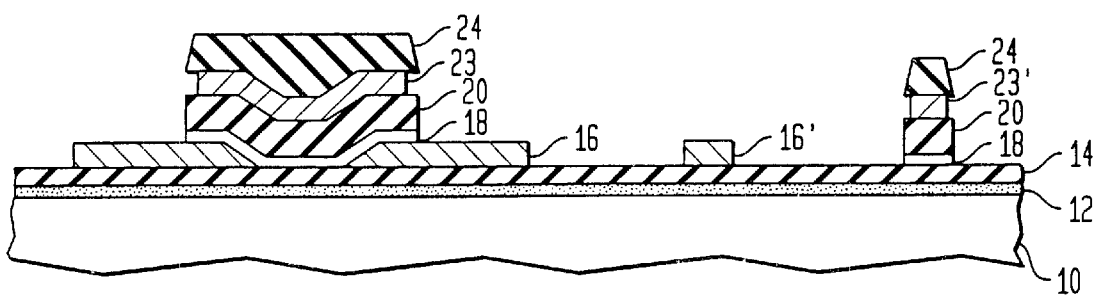

Subsequently, the gate insulating layer 20 and the semiconductor layer 18 are patterned by anisotropic etching using the pattern of the resist compound 24 as a mask. The gate insulating layer 20 and the semiconductor layer 18 are continuously etched by performing reactive ion-etching (RIE) using mixed gas of, for example, $CF_4$ and oxygen. The obtained structure is shown in FIG. 3(c). As is understood from FIG. 3(c), using the pattern of the resist compound 24 as a mask, the conductive layer 22 for use in forming the gate electrode is etched by isotropic etching, and, on the other hand, the gate insulating layer 20 and the semiconductor layer 18 are etched by anisotropic etching. Thus, the structure having an offset length around the gate electrode 23 can be obtained. If the offset length is not provided around the gate electrode 23, a distance between the end of the gate electrode 23 and one of the end of the source/drain electrode 16 and the end of the data line 16' is no longer than a total thickness of the gate insulating layer 20 and the semiconductor layer 18, that is, several 1000 Å. As a result, troubles such as the leak current and the short-circuit often occur owing to particles and humidity. However, with the structure having the offset length around the gate electrode 23, the possibility of occurrence of the leak current and the short-circuit can be decreased to a considerable low level. To avoid the problem of the leak current and the short-circuit, an offset length larger than the particles is formed. For example, a structure having an offset length of about 0.5 $\mu$m or more, preferably about 1 to about 2 $\mu$m, should be adopted.

Thereafter, using the source/drain electrode 16 and one of the pattern of the resist compound 23 and the gate electrode 23 as a mask, the interlayer insualting layer 14 and the light shielding layer 12 are etched. These layers should be preferably etched by isotropic etching such as plasma etching. The interlayer insulating layer 14 and the light shielding layer 12 are continuously etched by the plasma etching using mixed gas of $CF_4$ and hydrogen. Furthermore, side walls of the gate insulating layer 20 and the semiconductor layer 18, which have already been obtained by the previously performed etching, are also etched by the isotropic etching. If the gate insulating layer 20 is made of a material more prone to be etched than that of the interlayer insulating layer 14, the gate insulating layer 20 and the semiconductor layer 18 are over-etched. Over-etching in the region of the gate line 23' affords an offset-length between the end of the light shielding layer 12 and the end of the semiconductor layer 18, thus preventing the occurrence of the photo-induced leak current. On the other hand, if this offset length does not exist and the light shielding layer 12 and the semiconductor layer 18 are formed of the same pattern, the photo-induced leak current will occur in the semiconductor layer 18 owing to diffraction of light from the end of the light shielding layer 12. For this reason, charge cannot be held, and a display quality of the LCD may be degraded. The offset length should preferably be about 0.5 $\mu$m or more, and more preferably about 1 to 2 $\mu$m.

Figure 3D:
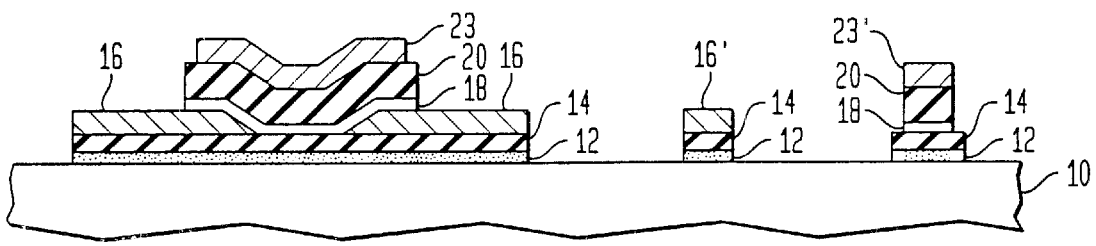

When the resist compound 24 left on the gate electrode 23 is removed, the top gate TFT structure as shown in FIG. 3(d) can be obtained. Alternatively, the resist compound 24 may be etched at the time between etching the semiconductor layer 18 and etching the interlayer insulating layer 14. However, the resist compound 24 should be preferably etched after etching the interlayer insulating layer 14 and the light shielding layer 12. The top gate TFT structure obtained by the method of the present invention has a structure that the periphery of the semiconductor layer 18 is inside of the periphery of the light shielding layer 12 and does not cross the periphery of the light shielding layer 12. Accordingly, the TFT structure of the present invention can exhibit an effect that the problems of the leak current and the short-circuit between the gate electrode 23 and the source/drain electrode 16 can be avoided in addition to an effect that the problem of the occurrence of the photo-induced leak current does not occur. Furthermore, with respect to the gate line 23', since periphery of the semiconductor layer 18 is inside of the periphery of the light shielding layer 12 and does not cross the periphery of the light shielding layer 12, the problem of the occurrence of the photo-induced leak current does not occur. On the other hand, since the light shielding layer 12 and the data line 16' are formed in self-alignment with each other, the light shielding layer 12 has no area more than necessary, so that an increase in an opening rate can be achieved.

As described above, the method of fabricating a TFT structure of the present invention requires only two masks of the patterns for the source/drain electrode and the pattern for the gate electrode, and does not require any mask for the light shielding layer, which has been heretofore required. An increase in a yield rate and a reduction in a manufacturing cost are expected to be achieved by the simplified steps as described above. In addition, the periphery of the semiconductor layer 18 is always inside of the periphery of the light shielding layer 12, and the structure that produces no photo-induced leak current can be obtained. Accordingly, the TFT-LCD fabricated by the method of the present invention can exhibit an excellent display quality.

In the case of an IPS (In-Plane Switching)-TFT-LCD, an orientation film is formed on the TFT array structure obtained by the method of the present invention, and the orientation film is made to face a color filter substrate interposing a liquid crystal layer therebetween. In the case of a TN (Twisted Nematic)-TFT-LCD, pixel electrodes are provided on the foregoing TFT array structure, and an orientation film is formed thereon. An obtained array side substrate is disposed so as to face a color filter side substrate interposing a liquid crystal layer therebetween, thus forming a liquid crystal cell. In forming the liquid crystal cell, after the array side substrate and the color filter side substrate are disposed so as to face each other with a proper gap, the liquid crystal may be injected therebetween. Or, alternatively, after the liquid crystal is applied onto one of the array side substrate and the color filter side substrate, the substrate onto which the liquid crystal was applied may be combined with another substrate.

Steps for assembling the liquid crystal cell with an LCD device have been well known.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by letters patent:

1. A method of fabricating a top gate TFT structure, comprising the steps of:
   depositing a light shielding layer on a substrate;
   depositing an interlayer insulating layer on said light shielding layer;
   forming source/drain electrodes on said interlayer insulating layer;
   depositing a semiconductor layer on said interlayer insulating layer with overlaying said source/drain electrodes;
   depositing a gate insulating layer on said semiconductor layer;
   depositing a gate metal layer on said gate insulating layer;
   providing a resist pattern for forming a gate electrode on said gate metal layer;
   patterning said gate metal layer, said gate insulating layer and said semiconductor layer using said resist pattern as a mask; and
   patterning said interlayer insulating layer and said light shielding layer using said source/drain electrodes as a mask.

2. The method according to claim 1,
   said method further comprising the step of:
      removing said resist pattern after patterning said interlayer insulating layer and said light shielding layer.

3. The method according to claim 1, wherein said semiconductor layer contains amorphous silicon.

4. The method according to claim 1, wherein said light shielding layer contains non-conductive inorganic compound.

5. The method according to claim 4, wherein said non-conductive inorganic compound is selected from a group composed of SiGe, $GeO_X$, $GeN_X$ and $NbO_X$.

6. The method according to claim 1, wherein said gate insulating layer, said semiconductor layer, the interlayer insulating layer and said light shielding layer are patterned by dry etching.

7. The method according to claim 1, wherein said interlayer insulating layer contains an insulating material selected from a group composed of $SiO_X$ and $SiO_XN_Y$ as a main component.

8. The method according to claim 6, wherein said gate insulating layer and said semiconductor layer are patterned by anisotropic etching.

9. The method according to claim 8, wherein said gate insulating layer and said semiconductor layer are patterned by reactive ion etching.

10. The method according to claim 9, wherein said gate insulating layer and said semiconductor layer are patterned by reactive ion etching in an atmosphere of gas containing fluoride.

11. The method according to claim 6, wherein said interlayer insulating layer and said light shielding layer are patterned by isotropic etching.

12. The method according to claim 11, wherein said interlayer insulating layer and said light shielding layer are patterned by plasma etching.

13. The method according to claim 12, wherein said interlayer insulating layer and said light shielding layer are patterned by plasma etching in etching gas containing hydrogen element.

14. The method according to claim 11, wherein said interlayer insulating layer and said light shielding layer are etched by isotropic etching, thereby over-etching said gate insulating layer and said semiconductor layer than said resist pattern.

15. The method according to claim 1, wherein said gate metal layer is patterned by wet etching.

16. The method according to claim 1, wherein said gate metal layer contains Mo.

17. The method according to claim 16, wherein said gate metal layer is etched using etchaht containing phosphoric acid and nitric acid.

18. The method according to claim 15, wherein said gate metal layer is over-etched more than resist pattern.

19. The method according to claim 1, wherein said gate metal layer is patterned by chemical dry etching.

20. A method of fabricating a TFT liquid crystal display device, comprising the steps of:
   depositing a light shielding layer on a substrate;
   depositing an interlayer insulating layer on said light shielding layer;
   forming source/drain electrodes on said interlayer insulating layer;
   depositing a semiconductor layer on said interlayer insulating layer with overlaying said source/drain electrodes;
   depositing a gate insulating layer on said semiconductor layer;
   depositing a gate metal layer on said gate insulating layer;
   forming a resist pattern for use in forming a gate electrode on said gate metal layer;
   patterning said gate metal layer, said gate insulating layer and said semiconductor layer using said resist pattern as a mask;
   patterning said interlayer insualting layer and said light shielding layer using said source/drain electrodes as a mask;
   removing said resist pattern;
   forming an orientation film thus completing a TFT array side substrate;
   forming a color filter side substrate;
   disposing said TFT array side substrate and said color filter side substrate so as to face each other; and
   injecting a liquid crystal layer between said TFT array side substrate and said color filter side substrate.

21. The method according to claim 20, wherein said light shielding layer is a non-conductive inorganic compound selected from a group composed of SiGe, $GeO_X$, $GeN_X$ and $NbO_X$.

22. The method according to claim 20, wherein said interlayer insulating layer contains an insulating material selected from a group composed of $SiO_X$ and $SiO_XN_Y$ as a main component, and said gate insulating layer contains $SiN_X$ as a main component.

23. The method according to claim 22, wherein said gate insulating layer and said semiconductor layer are patterned by anisotropic etching, and said interlayer insulating layer and said light shielding layer are patterned by isotropic etching, thus over-etching said gate insulating layer and said semiconductor layer than said interlayer insulating layer and said light shielding layer.

24. The method according to claim 20, wherein said gate metal layer is patterned by isotropic etching, and over-etched more than said resist pattern.

25. A TFT liquid crystal display device comprising:
a pair of substrates provided so as to face each other;
a liquid crystal layer located between said substrates;
a non-metallic light shielding layer provided on a surface of one of said substrate, the surface facing said liquid crystal layer;
an interlayer insulating layer provided on said non-metallic light insulating layer;
source/drain electrodes provided on said interlayer insulating layer;
a semiconductor layer provided on said interlayer insulating layer, the semiconductor layer partially covering said source/drain electrodes;
a gate insulating layer formed on said semiconductor layer; and
a gate electrode provided on said gate insulating layer;
wherein a periphery of said semiconductor layer is inside of a periphery of said non-metallic light shielding layer and does not cross the periphery of said light shielding layer, and wherein said non-metallic light shielding layer, said interlayer insulating layer and source/drain electrodes each have periphery edges that are in alignment with each other.

26. The TFT liquid crystal display device according to claim 25, wherein a periphery of said gate electrode is inside of a periphery of said semiconductor layer and does not cross the periphery of said semiconductor layer.

27. The TFT liquid crystal display device according to claim 25, wherein said non-metallic light shielding layer is a non-conductive inorganic compound selected from the group consisting of SiGe, $GeO_X$, $GeN_X$ and $NbO_X$.

28. A top gate TFT array comprising:
a substrate;
a non-metallic light shielding layer formed on said substrate;
an interlayer insulating layer formed on said non-metallic light shielding layer;
source/drain electrodes formed on said interlayer insulating layer;
a semiconductor layer formed on said interlayer insulating layer and overlaying partially said source/drain electrodes;
a gate insulating layer formed on said semiconductor layer; and
a gate electrode formed on said gate insulating layer,
wherein a periphery of said semiconductor layer is inside of a periphery of said non-metallic light shielding layer and does not cross the periphery of said light shielding layer, and wherein said non-metallic light shielding layer, said interlayer insulating layer and source/drain electrodes each have periphery edges that are in alignment with each other.

29. The top gate TFT array according to claim 28, wherein a periphery of said gate electrode is inside of the periphery of said semiconductor layer and does not cross the periphery of said semiconductor layer.

* * * * *